United States Patent [19]
McClure et al.

[11] Patent Number: 5,544,097
[45] Date of Patent: Aug. 6, 1996

[54] SRAM MEMORY CELL WITH REDUCED INTERNAL CELL VOLTAGE

[75] Inventors: David C. McClure; Mehdi Zamanian, both of Carrollton, Tex.

[73] Assignee: SGS-Thomson Microelectronics, Inc., Carrollton, Tex.

[21] Appl. No.: 414,918

[22] Filed: Mar. 31, 1995

[51] Int. Cl.$^6$ .................................................. G11C 11/40
[52] U.S. Cl. ..................... 365/154; 365/185.070
[58] Field of Search .............................. 365/154, 185.07, 365/156, 189.09

[56] References Cited

U.S. PATENT DOCUMENTS 5,452,246  9/1995  Kawashima .............................. 365/154

*Primary Examiner*—Tan T. Nguyen
*Attorney, Agent, or Firm*—Rodney M. Anderson; Lisa K. Jorgenson

[57] ABSTRACT

A memory cell having a first device operable to selectively conduct and coupled between a first cell node and a low voltage reference node and a second device operable to selectively conduct and coupled between a second cell node and the low voltage reference node. The memory cell further includes a first and second data line and circuitry for receiving a system level voltage and for biasing the first and second data lines at a first and second data voltage, respectively. Still further, the memory cell includes circuitry for coupling the first and second data line to the first and second cell node, respectively, such that a logical high voltage is selectively written to one of the first and second cell nodes while a logical low is written to the other of the first and second cell nodes during a write operation. Still further, the memory cell includes a voltage source node for receiving a cell voltage and circuitry for coupling the voltage source node to the first and second cell nodes. Lastly, the memory cell includes cell voltage circuitry for generating the cell voltage, wherein the cell voltage circuitry is operable to output a cell voltage less than the system level voltage.

24 Claims, 3 Drawing Sheets

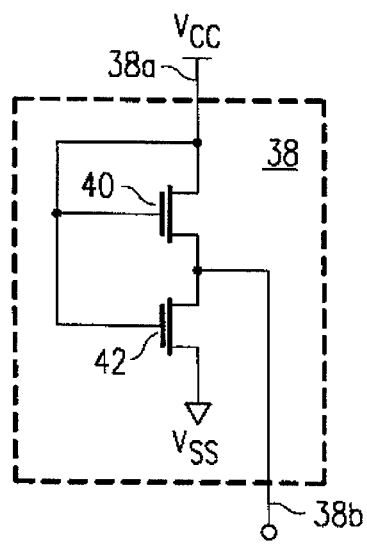
FIG. 3
$V_1 \doteq V_{CC} - T_{T40}$
FIG. 4
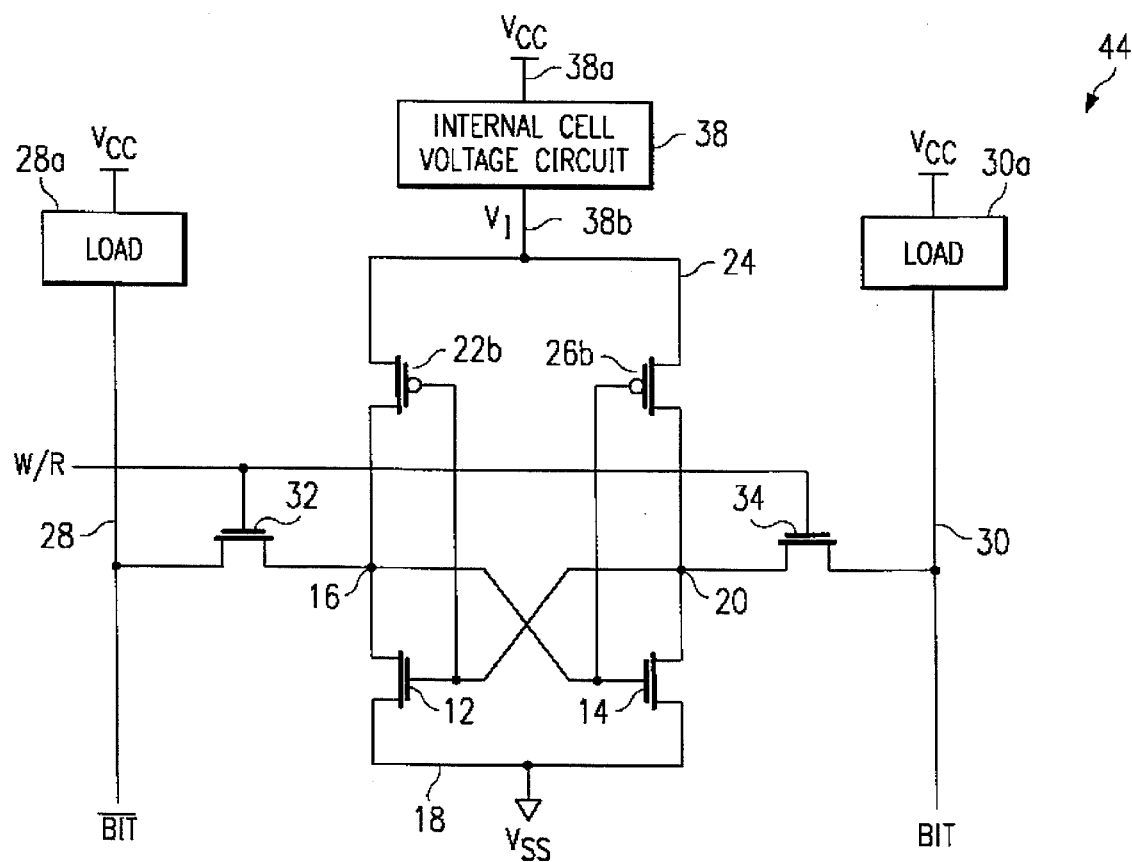

SRAM MEMORY CELL WITH REDUCED INTERNAL CELL VOLTAGE

This invention relates to memory cells, and is more particularly directed to an SRAM memory cell with a reduced internal cell voltage.

BACKGROUND OF THE INVENTION

Digital devices are constantly becoming more pervasive in numerous applications, such as personal computers, telecommunications, consumer electronic devices, and the like. Consequently, the use of digital memories also constantly increases. As a result, it is imperative to improve reliability of digital memories so that devices using such memories are likewise reliable.

The reliability of an SRAM cell depends on many factors. As detailed below, one key factor is the voltage level applied to such a cell. In order to appreciate the effect of such a voltage level, it is first instructive to demonstrate the prior art application of voltage to an SRAM cell. Toward that end, FIG. 1 illustrates a typical SRAM cell 10 connected in a known "4T-2R" configuration, that is, an SRAM cell having four transistors and two pull-up resistors. Specifically, cell 10 includes two n-channel transistors 12 and 14 configured in a cross-connected fashion. The drain of transistor 12 is connected to a cell node 16 and the source of transistor 12 is connected to a cell node 18. The drain of transistor 14 is connected to a cell node 20 and the source of transistor 12 is connected to node 18. The gate of transistor 12 is connected to cell node 20 while the gate of transistor 14 is connected to cell node 16. Node 18 is connected to a low reference potential, denoted Vss, which is typically connected to ground.

Nodes 16 and 20 are referred to herein as cell nodes as readily used in the art. Node 16 is connected through a pull-up resistor 22 to a voltage source node 24, and node 20 is connected through a pull-up resistor 26 to voltage source node 24. Voltage source node 24 is connected to a system level voltage, denoted $V_{cc}$, which is typically connected to a voltage on the order of 5 volts. $V_{cc}$ is referred to as a system level voltage because, as well known in the art, it is the supply voltage typically connected to other areas of a chip containing memory cell 10, as well as other related circuitry such as decoders, buffers, and the like. Note that the resistance value of resistors 22 and 26 is the same (given whatever level of tolerance is associated with those resistors), and is typically on the order of $10^{10}$ to $10^{12}$ Ohms.

Each of cell nodes 16 and 20 are connected in like fashion to a corresponding bit line 28 and 30, respectively. Particularly, cell node 16 is connected through an n-channel transistor 32 to bit line 28, and cell node 20 is connected through an n-channel transistor 34 to bit line 30. For reasons stated below, transistors 32 and 34 are referred to herein as passgate transistors. The gates of passgate transistors 32 and 34 are connected to a write/read line 35 (i.e., word line) which, as described below, receives a write/read signal (denoted "W/R") at a voltage level equal to $V_{cc}$ to allow writing to, or reading from, SRAM cell 10.

Bit lines 28 and 30 are each connected at one end to load elements 28a and 30a, respectively. Load elements 28a and 30a are biased by the same system level voltage as voltage source node 24, that is, $V_{cc}$. The voltage output by load elements 28a and 30a depends on the component selected as the load. Particularly, as known in the art, load elements 28a and 30a each typically consist of a single transistor. For example, each load element 28a and 30a may include a p-channel transistor with its source connected to $V_{cc}$, its gate to $V_{ss}$, and its drain connected to the respective bit line. In this instance, the drain voltage of the p-channel transistor would output a bias of $V_{cc}$ to the respective bit line. As a second example, each load element 28a and 30a may include an n-channel transistor with its gate and drain connected to $V_{cc}$, and its source connected to the respective bit line. In this instance, the source voltage of the n-channel transistor would output a bias of $V_{cc} - V_{Tnload}$ to the respective bit line, where $V_{Tnload}$ is the threshold voltage of the n-channel transistor of load elements 28a and 30a. Because of these alternative voltage levels on bit lines 28 and 30, FIG. 1 illustrates the potential from each load as "$V_{cc}$ OR $V_{Tnload}$".

At their other ends, bit lines 28 and 30 are each connected to circuitry (not shown), such as a driver/sense amplifier, for writing and reading a data bit to and from each of the bit lines. As known in the art, for a given memory cell, the signals along bit lines 28 and 30 are logically complementary. Consequently, for purposes of illustration in FIG. 1, bit line 28 is shown with a signal $\overline{BIT}$ while bit line 30 is shown with a signal BIT, that is, the logical complement of $\overline{BIT}$.

The operation of writing to cell 10 is as follows. Initially, logically complementary signals are connected to bit lines 28 and 30. These signals are typically accomplished using known pre-charging techniques. For example, if bit line 28 is to be logically high while bit line 30 is to be logically low, bit line 28 is allowed to fully pre-charge to $V_{cc}$ if a p-channel transistor is used within load 28 (or $V_{cc} - V_{Tnload}$ if an n-channel transistor is used within load 28), while bit line 30 is discharged. Next, W/R is asserted at $V_{cc}$ so that transistors 32 and 34 couple bit lines 28 and 30 to pull up, or pull down, nodes 16 and 20, respectively. Thus, transistors 32 and 34 act as gates which, when enabled, pass the data from bit lines 28 and 30 to transistors 16 and 20; therefore, transistors 32 and 34 are referred to herein as passgate transistors. Once the high from bit line 28 is coupled to cell node 16 and further to the gate of transistor 14, transistor 14 conducts. At the same time, the low from bit line 30 is coupled to cell node 20 and further to the gate of transistor 12, thereby keeping transistor 12 from conducting. Next, W/R is de-asserted. Because transistor 14 is now conducting, it will maintain a low potential at cell node 20 and, therefore, maintain transistor 12 in a nonconducting fashion. In addition, because transistor 12 is not conducting, and given the resistance size of resistor 22, the system level voltage $V_{cc}$ will continuously pull up cell node 16 to $V_{cc}$. Again, this voltage at cell node 16 connects to the gate of transistor 14 and, thus, maintains transistor 14 in a conducting fashion.

Given the above, one skilled in the art will recognize that, once passgate transistors 32 and 34 no longer conduct, the states of transistor 12 and 14 remain the same as caused by the complementary signals received from bit lines 28 and 30. Further, if the example were reversed (i.e., bit line 28 low while bit line 30 high), then the states of transistors 12 and 14 also would reverse, but again would remain static once passgate transistors 32 and 34 no longer conduct.

Having discussed a typical SRAM cell, recall from above that one key factor affecting SRAM cell reliability is the voltage level applied to such a cell. In the example of FIG. 1, this is the voltage level applied at voltage source node 24 which, in the prior art, is $V_{cc}$. In particular, it is known in the art that the transistors of SRAM cell 10 are commonly constructed with fairly thin interlevel oxides, that is, oxide layers between various layers or components, such as the gate oxide which separates the transistor gate from the underlying semiconductor, or other oxides between components layers. It is further known that such thin interlevel oxides are likely to degrade over time, particularly at high voltage levels. Consequently, one way to improve SRAM cell reliability over time is to lower voltages applied to the memory cell transistors. Because of this principle, in some prior art systems $V_{cc}$ has been reduced globally, that is, all nodes connected to $V_{cc}$ receive a lesser voltage potential. Thus, in FIG. 1, the voltage at voltage source node 24 would be reduced, as would the voltages on both loads 28a and 30a. By reducing the voltage in such a global manner, the life span of the SRAM cell is improved.

Unfortunately, the present invention recognizes that many memories or memory cell applications do not permit global reduction of $V_{cc}$. Further, a global reduction of $V_{cc}$ beyond a certain level may cause inaccurate operation and performance degradation. Therefore, it is an object of the present invention to provide an improved memory which operates with a non-reduced system level voltage of $V_{cc}$, while lowering the voltage internal to the cell to a value less than $V_{cc}$. By doing this, the memory has improved reliability with no performance degradation.

It is a further object of the present invention to provide such an improved memory having a greater reliability over prior art SRAM memory cells.

It is a further object of the present invention to provide such an improved memory which may be configured as a 4T-2R cell, 6-T cell, or other SRAM memory configuration benefitting from a reduced cell voltage.

It is a further object of the present invention to provide such an improved memory having a biasing circuit for producing a reduced cell voltage which is easily and efficiently included within the memory.

Still other objects and advantages of the present invention will become apparent to those of ordinary skill in the art having references to the following specification together with its drawings.

SUMMARY OF THE INVENTION

In the preferred embodiment, the present invention includes a memory cell having a first device operable to selectively conduct and coupled between a first cell node and a low voltage reference node and a second device operable to selectively conduct and coupled between a second cell node and the low voltage reference node. The memory cell further includes a first and second data line and circuitry for receiving a system level voltage and for biasing the first and second data lines at a first and second data voltage, respectively, wherein the first and second data voltages comprise logically complementary signals during a write operation. Still further, the memory cell includes circuitry for coupling the first and second data line to the first and second cell node, respectively, such that a logical high voltage is selectively written to one of the first and second cell nodes while a logical low is written to the other of the first and second cell nodes. Still further, the memory cell includes a voltage source node for receiving a cell voltage and circuitry for coupling the voltage source node to the first and second cell nodes. Lastly, the memory cell includes cell voltage circuitry for generating the cell voltage, wherein the cell voltage circuitry is operable to output the cell voltage less than the system level voltage.

BRIEF DESCRIPTION OF THE DRAWINGS

For a more complete understanding of the present invention, and the advantages thereof, reference is now made to the following descriptions taken in conjunction with the accompanying drawings, in which:

FIG. 3 illustrates the preferred embodiment of the internal cell voltage circuit of FIG. 2;

FIG. 4 illustrates an SRAM cell connected in a 6-T configuration and connected to a circuit for providing a reduced internal cell voltage in accordance with the present invention.

DETAILED DESCRIPTION OF THE PREFERRED EMBODIMENTS

The preferred embodiment of the present invention and its advantages are best understood by referring to FIGS. 1–5 of the drawings, like numerals being used for like and corresponding parts of the various drawings.

Figure 1:
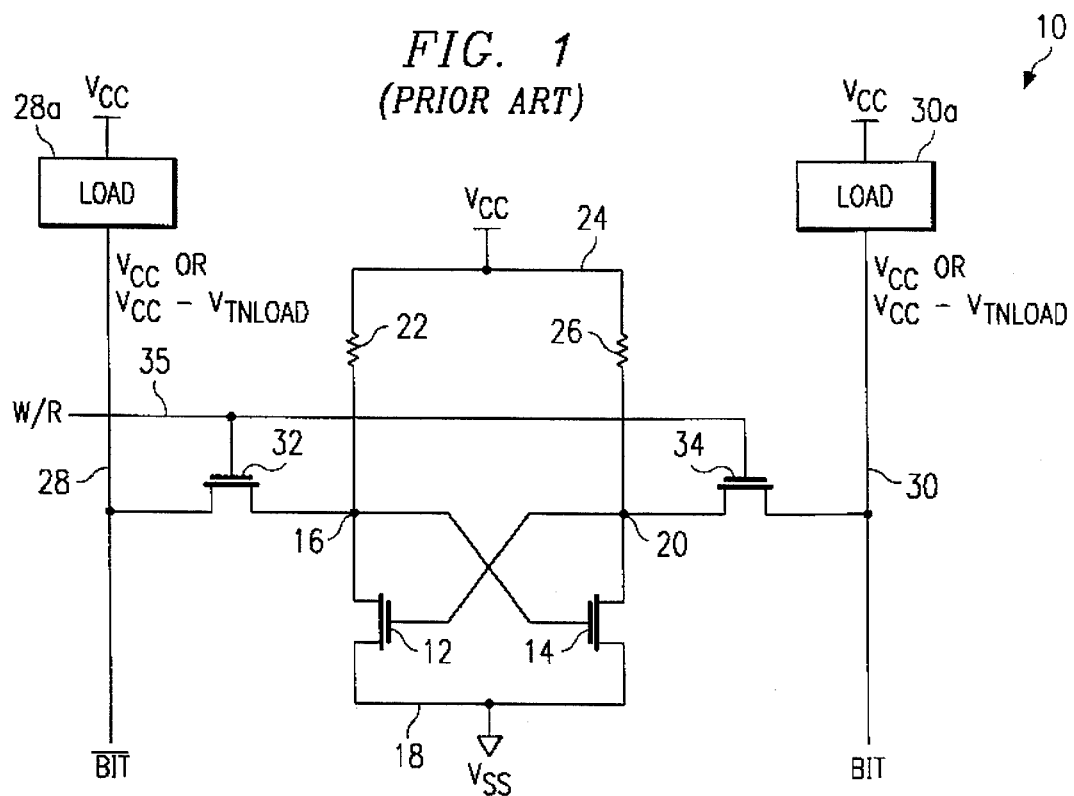
FIG. 1 illustrates a typical SRAM cell connected in a known "4T-2R" configuration.
Figure 2:
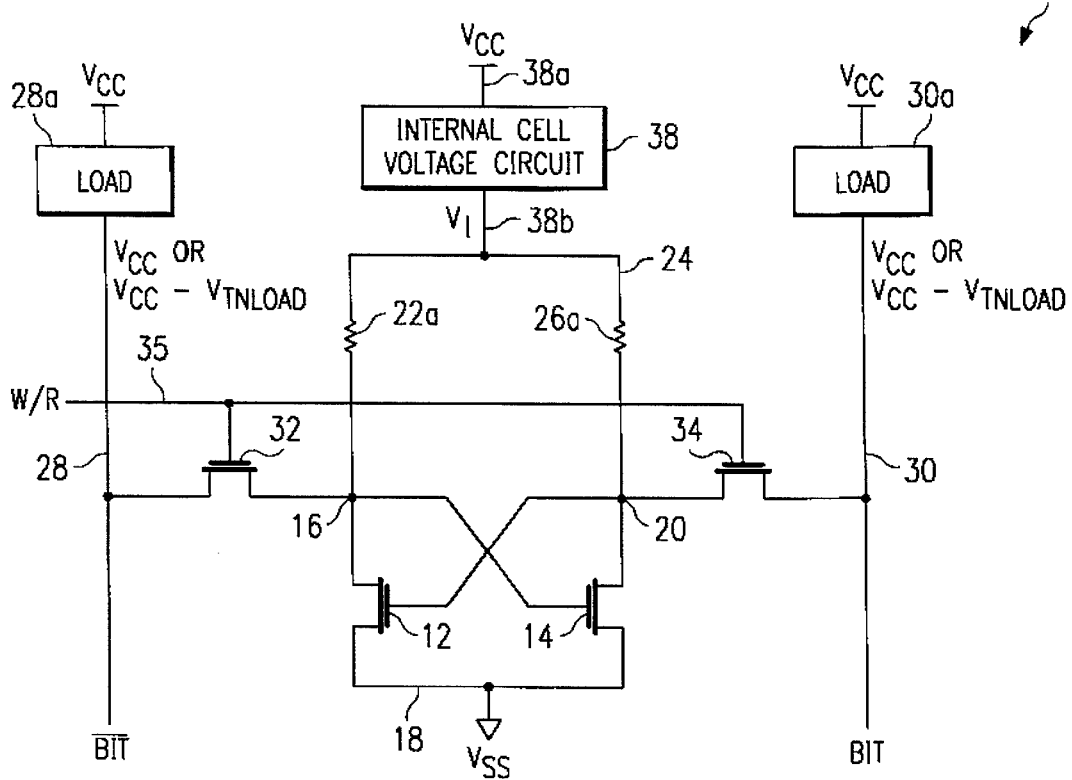
FIG. 2 illustrates an SRAM cell connected in a 4T-2R configuration and connected to a circuit for providing a reduced internal cell voltage in accordance with the present invention.

FIG. 2 illustrates an SRAM cell designated 36, but which is similar in various respects to SRAM cell 10 shown in FIG. 1. Indeed, where components are similar or the same between FIG. 1 and 2, like reference numerals are used. Referring now to the common components, cell 36 includes n-channel transistors 12 and 14 configured in a cross-connected fashion, and cell nodes 16 and 20. Again, cell nodes 16 and 20 are coupled by passgate transistors 32 and 34 to respective bit lines 28 and 30. Further, recall that bit lines 28 and 30 are coupled, via respective loads 28a and 30a, to $V_{cc}$ (or $V_{cc}-V_{Tnload}$) and, during a write operation, receive logically complementary signals with $\overline{BIT}$ on data line 28 and BIT on data line 30. Note also that the read operation is not detailed herein but is understood as known in the art.

With further reference to FIG. 2, cell nodes 16 and 20 are connected to voltage source node 24 via respective resistors. In FIG. 2, however, these resistors are labeled 22a and 26a because, as explained below, their values may differ slightly from the corresponding resistors 22 and 26 in FIG. 1. Typically, the resistance values of resistors 22a and 26a are the same (given whatever level of tolerance is associated with those resistors), and are typically on the order of $10^{10}$ to $10^{12}$ Ohms.

Unlike SRAM cell 10 of FIG. 1, in FIG. 2 voltage source node 24 is connected to receive a reduced internal cell voltage, denoted $V_I$. More particularly, voltage source node 24 is connected to the output 38b of an internal cell voltage circuit 38. The input 38a of internal cell voltage circuit 38 is connected to the system level voltage, $V_{cc}$. In the preferred embodiment, and for reasons set forth below, $V_I$ is less than $V_{cc}$.

The operation of writing to cell 36 is the same as to cell 10, but is described in greater detail so as to appreciate the additional benefits of cell 36 once data is written to the cell. Again, complementary signals are initially connected to bit lines 28 and 30 using loads 28a and 30a and known pre-charging techniques, and W/R is thereafter asserted at $V_{cc}$ so that passgate transistors 32 and 34 couple bit lines 28 and 30 to cell nodes 16 and 20, respectively. Assuming that bit line 28 is high (and, thus, bit line 30 is low), the present invention recognizes that the "logical high" voltage "written" to node 16 is a voltage level less than the full magnitude of $V_{cc}$. As detailed immediately below, this observation is true regardless of whether loads 28a and 30a use n-channel or p-channel transistors.

Before discussing the logical high voltage written to cell node 16 (or alternatively to cell node 20), it is instructive to evaluate the voltage magnitude at bit lines 28 and 30 in response to the type of transistor used in loads 28a and 30a. As stated above, when loads 28a and 30a each use an n-channel transistor, the data voltage, $V_D$, at the relatively high bit line (i.e., either line 28 or 30, with one being charged and the other discharged) is:

$$V_D = V_{cc} - V_{Tnload} \quad \text{Eqn. 1}$$

In other words, the threshold value of the n-channel load transistor is dropped across the load transistor, thereby placing a lesser voltage at the corresponding bit line 28 or 30. In contrast, when loads 28a and 30a each use a p-channel transistor, no threshold voltage is dropped across the p-channel transistor and, therefore, the data voltage, $V_D$, at the relatively high bit line (i.e., either line 28 or 30, with one being charged and the other discharged) is:

$$v_D = V_{cc} \quad \text{Eqn. 2}$$

From Eqns. 1 and 2, therefore, one skilled in the art will recognize that the magnitude of the data value on a bit line depends on the type of transistor used in loads 28a and 30a. As shown below, however, despite this difference, the magnitude of the logical high voltage written to cell node 16 (or node 20) is the same regardless of the type of load transistor (i.e., whether p-channel or n-channel).

To demonstrate the voltage "written" by the passgate transistors to the cell nodes, consider first the instance where bit line 28 is driven by a p-channel load device 28a. Also, this example will discuss the logical high, with it easily understood that the logical low operates in opposite fashion. Continuing this example, $V_{cc}$ is applied to the gate of passgate transistor 32, and (from Eqn. 2) the $V_{cc}$ voltage level on bit line 28 is connected to the drain of passgate transistor 32. Consequently, the voltage level "written" to cell node 16, $V_w$, will be the level to which the source of passgate transistor 32 is pulled, namely:

$$V_w = V_{cc} - V_{Tpass} \quad \text{Eqn. 3}$$

where $V_{Tpass}$ is the threshold voltage of passgate transistor 32. In other words, the source of passgate transistor 32 can only rise to the level shown in Eqn. 3; otherwise, an insufficient gate to source voltage would prevent transistor 32 from conducting.

To continue the demonstration of the voltage written by the passgate transistors to the cell nodes, consider second the instance where bit line 28 is driven by an n-channel load device 28a. Again, this example will discuss the logical high, with it easily understood that the logical low operates in opposite fashion. Continuing this example, $V_{cc}$ is applied to the gate of passgate transistor 32, and (from Eqn. 1) the $V_{cc} - V_{Tnload}$ voltage level on bit line 28 is connected to the drain of passgate transistor 32. In addition, note that the threshold voltage of passgate transistors 32 and 34 preferably exceeds the threshold voltage for the transistors in loads 28a and 30a due to the preferable differing device dimensions. Consequently, the voltage level written to cell node 16, $V_w$, will be limited at its upper limit by the threshold voltage of the passgate transistor rather than the threshold voltage of the load transistor. As a result, $V_w$ in this example is:

$$V_w = V_{cc} - V_{Tpass} \quad \text{Eqn. 4}$$

where $V_{Tpass}$ is again the threshold voltage of passgate transistor 32. In other words, even though the drain voltage is a greater level, namely, $V_{cc} - V_{Tnload}$, the source of passgate transistor 32 can only rise to the lesser level shown in Eqn. 4; otherwise, an insufficient gate to source voltage would prevent transistor 32 from conducting.

From the above, therefore, and most easily shown in the same result reached in Eqns. 3 and 4, the present invention recognizes that regardless of the type of load device on bit lines 28 and 30, $V_w$ is approximately the system level voltage ($V_{cc}$) minus the threshold voltage of the passgate transistor ($V_{Tpass}$). Further, as known in the art, the value of $V_{Tpass}$ depends on the characteristics of transistor 32, as well as the backgate bias of transistor 32.

Having discussed the voltage written to a cell node 16 or 20, note the following after passgate transistors 32 and 34 are simultaneously gated on. Initially, W/R is de-asserted. Again, and as in the discussion of FIG. 1, after de-asserting W/R, cell node 16 is pulled-up to the voltage at voltage source node 24. Thus, in the prior art, node 16 is pulled up to $V_{cc}$. However, in FIG. 2, this voltage at voltage source node 24 equals $V_I$ which, as stated above, is a voltage level less than $V_{cc}$. Further, because it is recognized that the voltage, $V_w$, written to cell nodes 16 and 20 equals $V_{cc} - V_{Tpass}$, then $V_I$ is preferably also equal to, or slightly greater than, $V_{cc} - V_{Tpass}$. In other words, if $V_I$ equals $V_{cc} - V_{Tpass}$, then after W/R is de-asserted, the voltage at cell node 16 is maintained at the same magnitude received from passgate transistor 32 (i.e., at $V_{cc} - V_{Tpass}$). Further, this reduced voltage magnitude, $V_{cc} - V_{Tpass}$, remains coupled to the gate of transistor 14, thereby maintaining cell 36 in a fixed data state for a subsequent data read of the cell.

From the above, note that the pulled-up bias applied to the gates of transistors 12 and 14 is effectively reduced when compared to the prior art. Specifically, one of the two transistors 12 and 14 must remain conducting (i.e., depending on the data in the cell) and, in the prior art, this conduction was ensured by pulling the gate of the conducting transistor up to $V_{cc}$. In other words, in the prior art, initially a voltage of $V_{cc} - V_{Tpass}$ was applied to either cell node 16 or 20 during the time transistors 32 and 34 conduct. Once transistors 32 and 34 no longer conducted, however, either cell node 16 or 20 was then pulled up from a voltage of $V_{cc} - V_{Tpass}$ to a voltage $V_{cc}$. However, in the present invention, this conduction is ensured by pulling the gate of the conducting transistor to a reduced internal voltage: $V_I = V_{cc} - V_{Tpass}$ (or a slightly greater voltage, but still one which is less than $V_{cc}$). As a result, an overall lesser voltage is applied to transistors 12 and 14, thereby reducing the negative effects described above which occur when higher voltages are imposed on the gate oxides and other interlevel oxides of such transistors. Thus, cell reliability is increased, particularly given the exponential dependence of transistor oxide reliability on applied potentials.

Before proceeding, recall also that it was stated in connection with FIG. 2 that the resistance values of resistors 22a and 26a may be slightly different than that of resistors 22 and 26 in FIG. 1. One skilled in the art will appreciate now this change since the voltage applied to cell voltage source node 24 is reduced in FIG. 2 and, therefore, the resistances of resistors 22a and 26a may be changed accordingly.

FIG. 3 illustrates the preferred embodiment of the internal cell voltage circuit 38 of FIG. 2. The voltage input 38a of circuit 38 is connected to the gate and drain of an n-channel transistor 40. In the preferred embodiment, n-channel transistor 40 is similar in characteristics to passgate transistors 32 and 34 (see FIG. 2), but has a slightly larger channel width than those transistors. Typically, depending on the process flow, and as known in the art, the larger channel width often reduces the effect of field oxide encroachment and, consequently, lowers the threshold voltage of the transistor. In other words, because of its larger channel width, the threshold voltage of transistor 40, denoted $V_{T40}$, could be slightly lower than the threshold voltage of passgate transistors 32 and 34, as shown by the following Eqn. 5:

$$V_{Tpass} > V_{T40} \qquad \text{Eqn. 5}$$

again where, $V_{Tpass}$ is the threshold voltage of either of passgate transistors 32 or 34. Moreover, device 42 is a very weak load device which, in the preferred embodiment, is a second n-channel transistor. Thus, assuming the voltage drop across device 42 is small, then Eqn. 6 below shows the output voltage, $V_I$, of circuit 38:

$$V_I \approx V_{cc} - V_{T40} \qquad \text{Eqn. 6}$$

Therefore, substituting Eqn. 5 into Eqns. 4 and 6, the following Eqn. 7 compares: (1) the voltage, $V_I$, at cell nodes 16 and 20 under the internal cell voltage from circuit 38; and (2) the voltage, $V_w$, written to nodes 16 and 20 during conduction of the passgate transistor:

$$(V_I = V_{cc} - V_{T40}) \geq (V_w = V_{cc} - V_{Tpass}) \qquad \text{Eqn. 7}$$

Eqn. 7, therefore, demonstrates that $V_I$ is greater than or equal to $V_w$. However, in order to maintain as low a voltage as possible on transistors 12 and 14, while still ensuring proper operation of cell 36, transistor 40 is selected so that its threshold voltage is only slightly smaller than the $V_{Tpass}$, the threshold voltage of the passgate transistors. Consequently, while Eqn. 7 demonstrates that $V_I$ is greater than $V_w$, the difference is preferably minimized in this fashion.

Having described the basic principles of circuit 38, note a few additional aspects with respect to its internal components. In addition to sizing the width of transistor 40 as set forth above, note that transistor 40 is also sized to provide the necessary current consumed by the memory array while still operating with its gate-to-source voltage equal to $V_{Tpass}$. Current consumption is analyzed taking into consideration parameters such as parasitic and normal operational current. Further, note from above that device 42 is preferably an n-channel transistor connected as shown. Note also that the gate of the n-channel transistor is shown as connected to $V_{cc}$, but could be connected to any alternative bias voltage sufficiently large to allow the n-channel transistor to conduct. Further, in an alternative embodiment, a different load device may be used such as a resistor or other load element. In any event, device 42 is selected to maintain $V_I$ at the level shown by Eqn. 6 under conditions where $V_{cc}$ bumps up and then down. Note further, however, that element 42 can be eliminated if bump is not a concern.

FIG. 4 illustrates an SRAM cell designated 44. Cell 44 is connected in a 6-T configuration and, thus, is connected in the same manner as the 4T-2R cell 36 of FIG. 2, with the exception that resistors 22a and 26a of FIG. 2 are replaced in FIG. 5 with p-channel transistors 22b and 26b, respectively. The gates of transistors 22b and 26b are connected to cell nodes 20 and 16, respectively. Note that cell 44 includes a circuit 38 in the same manner as cell 36 of FIG. 2, and again which provides a reduced internal cell voltage, $V_I$, to voltage source node 24.

The operation of writing to cell 44 is similar to cell 36, with the exception that p-channel transistors 22b and 26b conduct in accordance with the voltages at cell nodes 20 and 16. For example, when cell node 20 is high (and, therefore, cell node 16 is low), transistor 12 conducts, as does transistor 26b. Thus, transistor 22b operates as a load much in the same manner as resistor 22a of FIG. 2. Of course, when cell node 16 is high (and cell node 20 is low), transistor 14 conducts, as does transistor 22b, and transistor 26b operates as a load much in the same manner as resistor 26a of FIG. 2.

In view of the comparability of cell 44 to cell 36, a comprehensive discussion of the operation of cell 44 is apparent from the description of cell 36 above and need not be re-stated in detail. However, it is noteworthy to appreciate that the reduced cell voltage internal to cell 44 also reduces the degrading effect on the interlevel oxides of that cell and, therefore, again increases device reliability and longevity.

Figure 5:
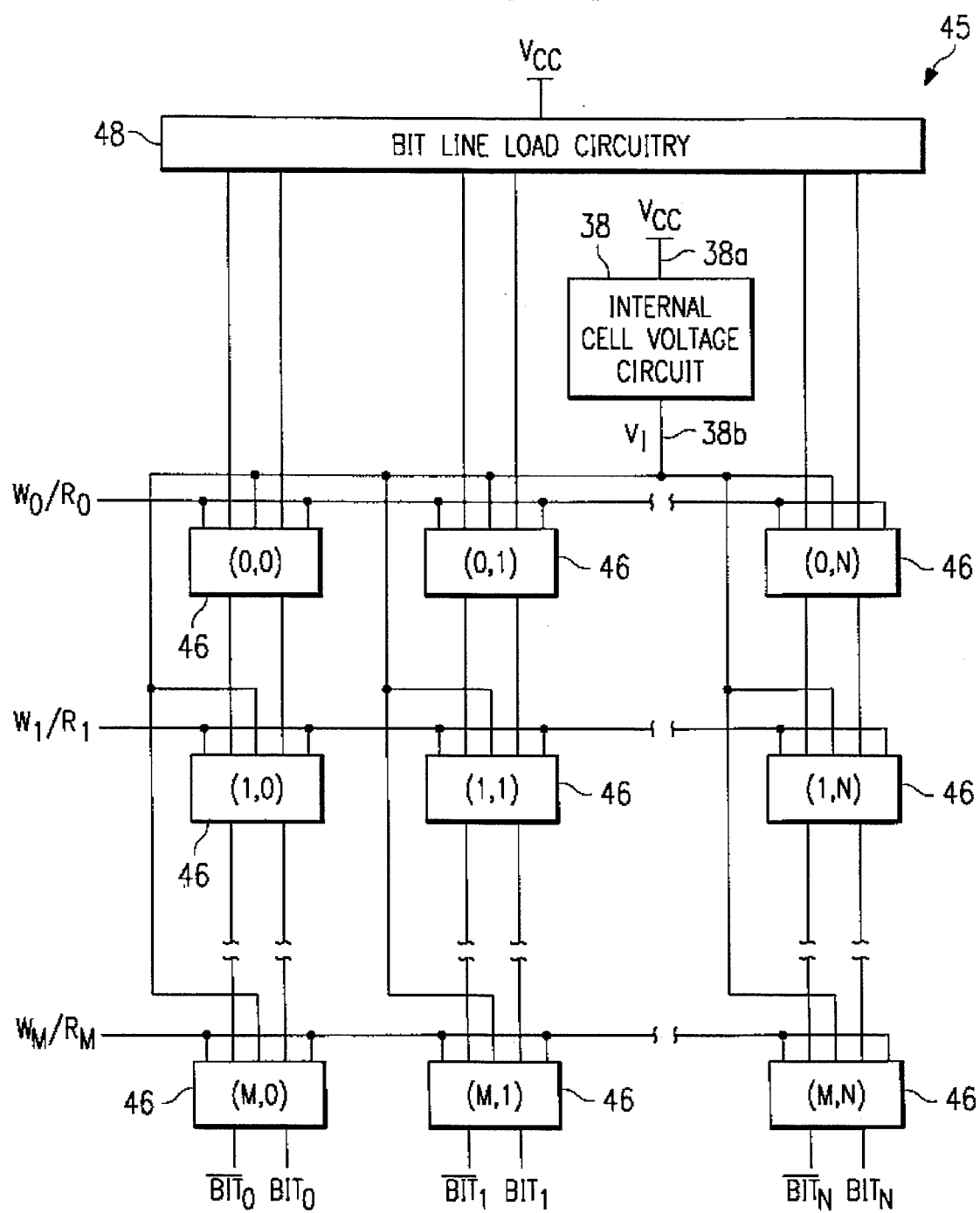
FIG. 5 illustrates a memory array of SRAM cells, wherein each cell receives a reduced internal cell voltage.

The cells described above provide numerous benefits as set forth above and further detailed below. As yet another example, FIG. 5 illustrates a memory array 45 in a diagrammatic fashion. In array 45, each of blocks 46 represents a cell such as cell 36 of FIG. 2 or cell 44 of FIG. 4. In other words, array 45 comprises a plurality of memory cells, wherein each cell has its nodes connected to a reduced internal cell voltage circuit 38. Globally, however, array 45 is illustrated as having an integer M number of rows, and an integer N number of columns. Each memory row is coupled to a common read/write line (i.e., word line) so that an entire row may be accessed at one time. Moreover, each column has complementary bit lines connected to bit line load circuitry 48, so that a cell in an accessed row may be either written or read. In all events, array 45 is improved in its entirety by including improved cells 46. Again, device reliability and longevity are improved in accordance with the present invention.

From the above, it may be appreciated that the embodiments of the present invention provide an improved memory which operates without globally reducing $V_{cc}$, while lowering the cell voltage internal to the cell to a value less than $V_{cc}$. Further, the voltage on the cell nodes during static storage approaches the magnitude initially written to the cell. In addition, the internal cell voltage circuit effectively tracks and matches the voltage established in the cell during the write operation. This tracking operation prevents the cell voltage from falling too low, thereby causing reduced cell speed and stability, or from climbing too high, thereby causing reliability problems due to degraded transistor interlevel oxides. Further, the reduced voltage is applied internally to the cell nodes of the cell while, in the instance of bit lines driven with p-channel load transistors, the data lines remain alternatively charged at a higher potential (i.e., $V_{cc}$). Thus, the invention may be implemented in systems where only $V_{cc}$ is available to the overall system, that is, where only global scaling of $V_{cc}$ is possible. Still further, the invention improves memory reliability, and may be configured as a 4T-2R cell, 6-T cell, or other SRAM memory configuration benefitting from an internally reduced cell voltage. In addition, the present invention provides such an improved memory having an internal cell voltage circuit which is easily and efficiently included within the memory. It also should be noted that the invention includes alternatives, thereby demonstrating some of the examples available to a person skilled in the art of practicing the subject invention. However, while the present invention has been described in detail, various substitutions, modifications or alterations could be made to the descriptions set forth above without departing from the invention which is defined by the following claims.

What is claimed is:

1. A memory cell comprising:

a first device operable to selectively conduct and coupled between a first cell node and a low voltage reference node;

a second device operable to selectively conduct and coupled between a second cell node and said low voltage reference node;

a first and second data line;

circuitry for receiving a system level voltage and for biasing said first and second data lines at a first and second data voltage, respectively, wherein said first and second data voltages comprise logically complementary signals;

circuitry for coupling said first and second data line to said first and second cell node, respectively, such that a logical high voltage is selectively written to one of said first and second cell nodes while a logical low is written to the other of said first and second cell nodes during a write operation;

a voltage source node for receiving a cell voltage;

circuitry for coupling said voltage source node to said first and second cell nodes; and cell voltage circuitry, coupled between the system level voltage and the voltage source node, for generating the cell voltage, wherein said cell voltage circuitry is operable to output the cell voltage less than said system level voltage.

2. The memory cell of claim 1 wherein said circuitry for coupling said first and second data line to said first and second cell node, respectively, comprises first and second passgate transistors, wherein each of said passgate transistors has a threshold voltage, and wherein said cell voltage equals said system level voltage minus said threshold voltage.

3. The memory cell of claim 1 wherein said circuitry for coupling said first and second data line to said first and second cell node, respectively, comprises first and second passgate transistors, wherein each of said passgate transistors has a threshold voltage, and wherein said cell voltage is greater than or equal to said system level voltage minus said threshold voltage.

4. The memory cell of claim 1 wherein said first and second devices operable to selectively conduct comprise n-channel transistors.

5. The memory cell of claim 1 wherein said circuitry for coupling said first and second data line to said first and second cell node comprises a first and second transistor.

6. The memory of claim 5 wherein each of said first and second transistors has a channel width of a first size, and wherein said cell voltage circuitry for generating the cell voltage comprises:

a third transistor having a channel width larger than said first size, wherein said third transistor is connected to receive said system level voltage at its gate and its drain; and wherein the source of said third transistor is operable to output said cell voltage.

7. The memory cell of claim 6 and further comprising a load element connected at a first end to the source of said third transistor and at a second end to a low reference voltage.

8. The memory cell of claim 7 wherein said load element comprises an n-channel transistor, wherein said n-channel transistor has a drain connected as said first end of said load element, wherein said n-channel transistor has a source connected as said second end of said load element, and wherein said n-channel transistor has a gate connected to receive a bias voltage.

9. The memory cell of claim 1 wherein said circuitry for coupling said voltage source node to said first and second cell nodes comprises:

a first resistor connected between said voltage source node and said first cell node; and a second resistor connected between said voltage source node and said second cell node.

10. The memory cell of claim 9 wherein said first and second resistors have like resistance values.

11. The memory cell of claim 1 wherein said circuitry for coupling said voltage source node to said first and second cell nodes comprises:

a first p channel transistor connected between said voltage source node and said first cell node; and a second p channel transistor connected between said voltage source node and said second cell node.

12. The memory cell of claim 11 wherein said first and second p channel transistors are like devices.

13. A memory cell comprising:

a first transistor operable to selectively conduct and coupled between a first cell node and a low voltage reference node;

a second transistor operable to selectively conduct and coupled between a second cell node and said low voltage reference node;

a first and second data line;

circuitry for receiving a system level voltage and for biasing said first and second data lines at a first and second data voltage, respectively, wherein said first and second data voltages comprise logically complementary signals;

a first passgate transistor for selectively coupling said first data line to said first cell node, wherein said first passgate transistor has a threshold voltage;

a second passgate transistor for selectively coupling said second data line to said second cell node, wherein said second passgate transistor has a threshold voltage substantially the same as said threshold voltage of said first passgate transistor;

wherein the operation of said first and second passgate transistors is such that a logical high voltage is selectively written to one of said first and second cell nodes while a logical low is written to the other of said first and second cell nodes during a write operation;

a voltage source node for receiving a cell voltage;

a first load device for coupling said voltage source node to said first cell node;

a second load device for coupling said voltage source node to said second cell node; and cell voltage circuitry, coupled between the system level voltage and the voltage source node for generating the cell voltage, wherein said cell voltage circuitry is operable to output the cell voltage less than said system level voltage and greater than or equal to said system level voltage minus said threshold voltage.

14. The memory cell of claim 13 wherein said first and second transistors each comprise an n-channel transistor.

15. The memory of claim 13 wherein each of said first and second passgate transistors has a channel width of a first size, and wherein said cell voltage circuitry for generating the cell voltage comprises:

a third transistor having a channel width larger than said first size, wherein said third transistor is connected to receive said system level voltage at its gate and its drain; and wherein said source of said third transistor is operable to output said cell voltage.

16. The memory cell of claim 15 and further comprising a load element connected at a first end to the source of said third transistor and at a second end to a low reference voltage.

17. The memory cell of claim 16 wherein said load element comprises an n-channel transistor, wherein said n-channel transistor has a drain connected as said first end of said load element, wherein said n-channel transistor has a source connected as said second end of said load element, and wherein said n-channel transistor has a gate connected to receive a bias voltage.

18. The memory cell of claim 13 wherein said first load device comprises a first resistor connected between said voltage source node and said first cell node, and wherein said second load device comprises a second resistor connected between said voltage source node and said second cell node.

19. The memory cell of claim 18 wherein said first and second resistors have like resistance values.

20. The memory cell of claim 13 wherein said first load device comprises a first p channel transistor connected between said voltage source node and said first cell node, and wherein said second load device comprises a second p channel transistor connected between said voltage source node and said second cell node.

21. The memory cell of claim 20 wherein said first and second p channel transistors are like devices.

22. A memory array, comprising:
   a plurality of cells arranged in rows and columns;
   a plurality of word lines arranged in rows, wherein each cell in any one of said rows may be accessed at a single time by asserting a signal on a word line corresponding to said one of said rows being accessed;
   wherein each of said plurality of memory cells comprises:
      a first device operable to selectively conduct and coupled between a first cell node and a low voltage reference node;
      a second device operable to selectively conduct and coupled between a second cell node and said low voltage reference node;
      a first and second data line;
      circuitry for receiving a system level voltage and for biasing said first and second data lines at a first and second data voltage, respectively, wherein said first and second data voltages comprise logically complementary signals;
      circuitry for coupling said first and second data line to said first and second cell node, respectively, such that a logical high voltage is selectively written to one of said first and second cell nodes while a logical low is written to the other of said first and second cell nodes during a write operation;
      a voltage source node for receiving a cell voltage;
      circuitry for coupling said voltage source node to said first and second cell nodes; and
      cell voltage circuitry for generating the cell voltage, wherein said cell circuitry, coupled between the system level voltage and the voltage source node is operable to output the cell voltage less than said system level voltage.

23. The memory array of claim 22, wherein for each of said memory cells said circuitry for coupling said first and second data line to said first and second cell node, respectively, comprises first and second passgate transistors, wherein each of said passgate transistors has a threshold voltage, and wherein said cell voltage equals said system level voltage minus said threshold voltage.

24. The memory array of claim 22, wherein for each of said memory cells said circuitry for coupling said first and second data line to said first and second cell node, respectively, comprises first and second passgate transistors, wherein each of said passgate transistors has a threshold voltage, and wherein said cell voltage is greater than or equal to said system level voltage minus said threshold voltage.

* * * * *